US011695068B2

(12) United States Patent
Patel

(10) Patent No.: US 11,695,068 B2
(45) Date of Patent: Jul. 4, 2023

(54) GREYSCALE LITHOGRAPHY FOR DOUBLE-SLANTED GATE CONNECTED FIELD PLATE

(71) Applicant: Insyt, Inc., San Jose, CA (US)

(72) Inventor: Kedar Patel, San Jose, CA (US)

(73) Assignee: Insyt, Inc., San Jose, CA (US)

( * ) Notice: Subject to any disclaimer, the term of this patent is extended or adjusted under 35 U.S.C. 154(b) by 207 days.

(21) Appl. No.: 17/197,008

(22) Filed: Mar. 9, 2021

(65) Prior Publication Data

US 2021/0280678 A1 Sep. 9, 2021

Related U.S. Application Data

(60) Provisional application No. 62/987,271, filed on Mar. 9, 2020.

(51) Int. Cl.
| | |
|---|---|
| *H01L 29/778* | (2006.01) |
| *H01L 29/40* | (2006.01) |
| *H01L 29/66* | (2006.01) |
| *H01L 21/027* | (2006.01) |

(52) U.S. Cl.
CPC ...... *H01L 29/7786* (2013.01); *H01L 21/0274* (2013.01); *H01L 29/402* (2013.01); *H01L 29/66462* (2013.01); *H01L 29/401* (2013.01)

(58) Field of Classification Search
CPC ............... H01L 29/402; H01L 29/7786; H01L 29/66462; H01L 27/027; H01L 27/0274
See application file for complete search history.

(56) References Cited

U.S. PATENT DOCUMENTS

| 7,692,263 | B2 | 4/2010 | Wu et al. | |
|---|---|---|---|---|
| 8,530,978 | B1* | 9/2013 | Chu ................ | H01L 29/66462 257/192 |
| 9,831,315 | B2 | 11/2017 | Chu et al. | |
| 10,050,136 | B2 | 8/2018 | Iucolano | |
| 2013/0313560 | A1* | 11/2013 | Khalil .............. | H01L 29/66469 257/E21.403 |
| 2017/0170284 | A1* | 6/2017 | Li ..................... | H01L 29/7783 |

OTHER PUBLICATIONS

Coffie, "Slant Field Plate Model for Field-Effect Transistors," *IEEE Transactions on Electron Devices*, Aug. 2014, (6 pages).
Wong, "Novel Asymmetric Slant Field Plate Technology for High-Speed Low-Dynamic $R_{on}$ E/D-mode GaN HEMTs," *IEEE Electron Device Letters*, 38(1), Jan. 2017. (4 pages).

* cited by examiner

*Primary Examiner* — Joseph C. Nicely
(74) *Attorney, Agent, or Firm* — Newport IP, LLC; Tyler Thorp

(57) ABSTRACT

Methods for manufacturing double-slanted gate connected field plates that allow for the simultaneous optimization of electric field distributions between gate and drain terminals and gate and source terminals are described. A technical benefit of manufacturing the double-slanted gate connected field plate using greyscale lithography is that fabrication costs may be substantially reduced by reducing the number of process steps required to form the double-slanted gate connected field plate. The source-side slope and the drain-side slope of the double-slanted gate connected field plate may be concurrently formed with two different slopes or two different step profiles.

9 Claims, 11 Drawing Sheets

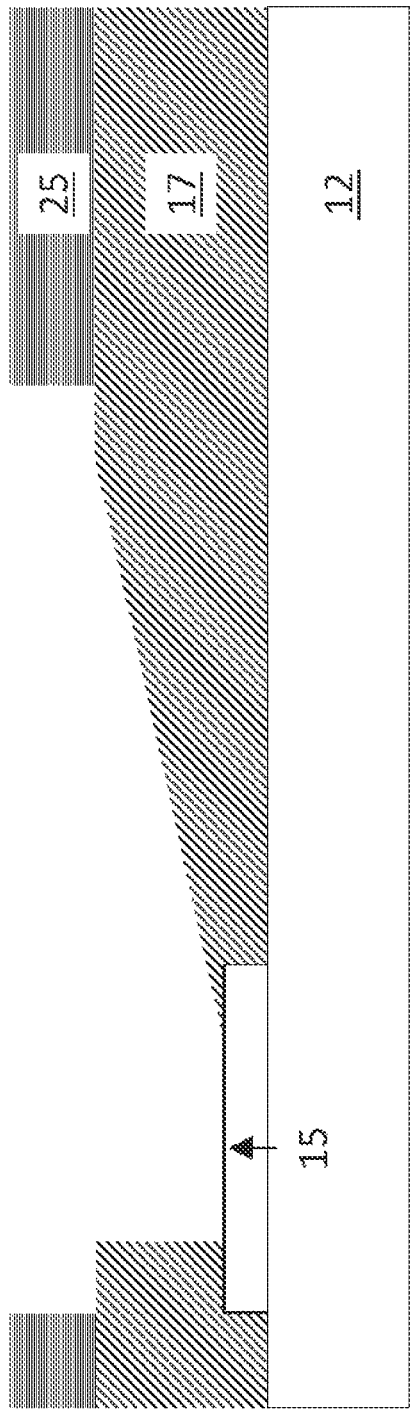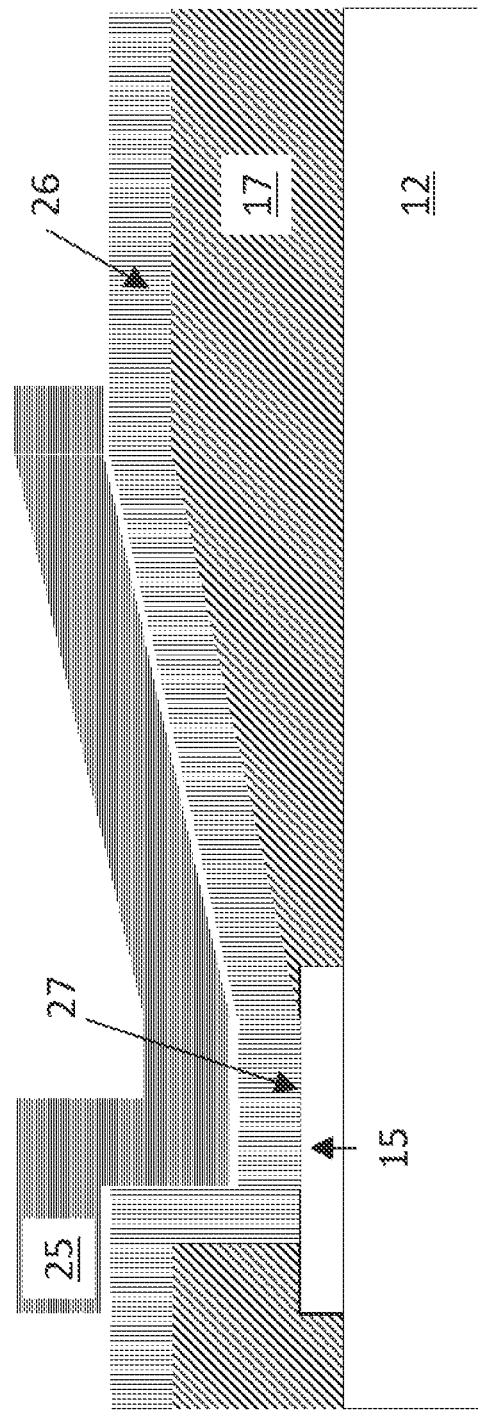

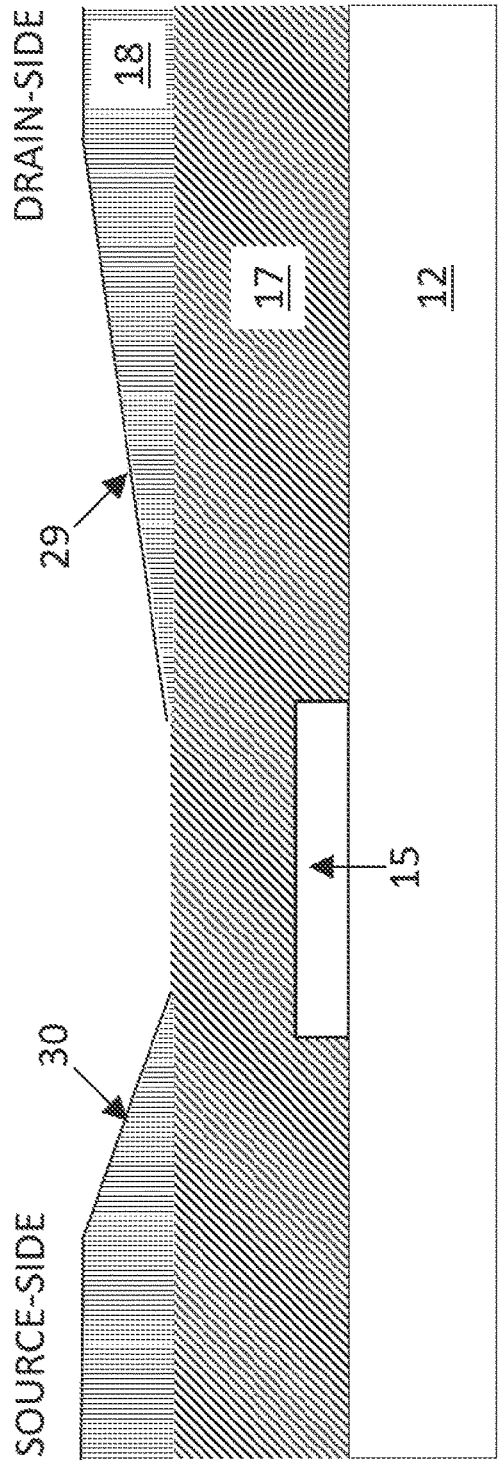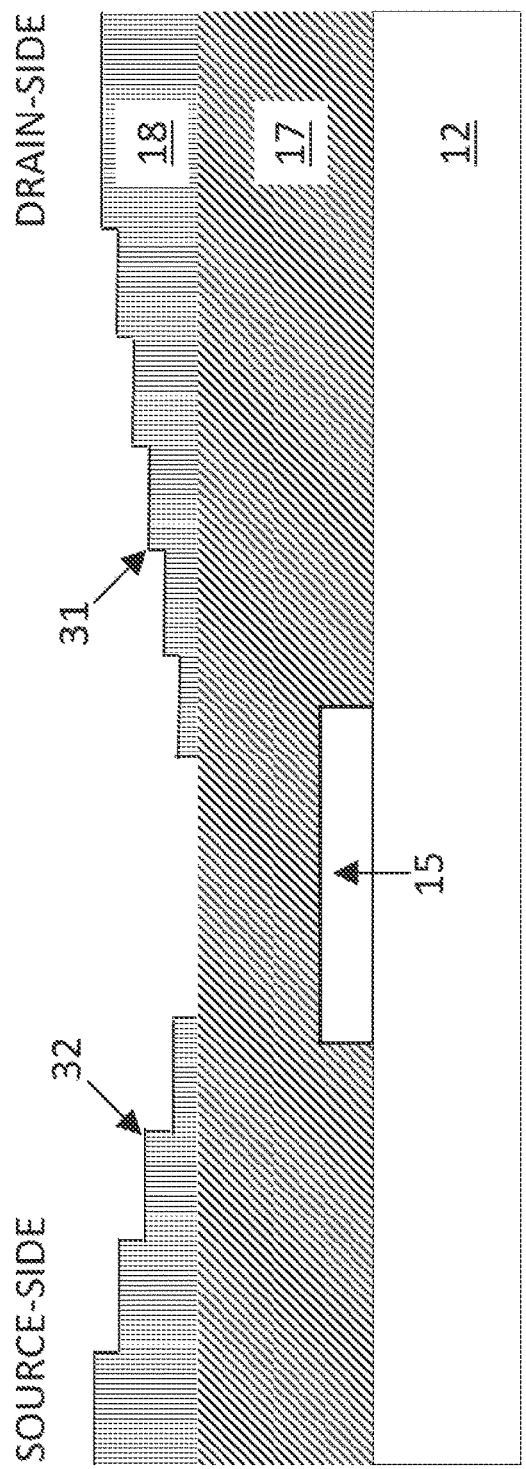

US 11,695,068 B2

GREYSCALE LITHOGRAPHY FOR DOUBLE-SLANTED GATE CONNECTED FIELD PLATE

CLAIM OF PRIORITY

The present application claims priority to U.S. Provisional Application No. 62/987,271, entitled "Greyscale Lithography for Double-Slanted Gate Connected Field Plate," filed Mar. 9, 2020, which is herein incorporated by reference in its entirety.

BACKGROUND

Fabrication of an integrated circuit or a semiconductor device typically requires various physical and chemical processes to be performed on layers formed above a semiconductor substrate (e.g., a silicon substrate). These processes include film deposition, patterning, semiconductor doping, and etching. Fundamental to many of these processes is the use of photolithography, in which a pattern may be transferred from a photolithographic mask onto a substrate or deposited film.

BRIEF DESCRIPTION OF THE DRAWINGS

FIGS. 5A, 5B, 6, and 7 depict various cross-sectional views associated with semiconductor fabrication.

FIGS. 8A-8B depict one embodiment of process steps for forming a double-slanted gate connected field plate.

DETAILED DESCRIPTION

In field effect transistors for power switching applications, the electric field distribution needs to be optimized between two terminals with a high voltage (e.g., a voltage greater than 200V). If the electric field distribution is not properly engineered, it may lead to device performance degradation (such as dynamic ON-resistance or current dispersion) or high leakage current leading to a possibly premature breakdown. Slanted or sloped field plates can be used to reduce the peak electric field. A slanted field plate may be connected to a gate or source terminal. In some cases, both the gate and source terminals of a field effect transistor may be connected to different slanted field plates. The present application provides an efficient method to manufacture a double-slanted gate connected field plate that may simultaneously optimize electric field distribution between gate and drain terminals and gate and source terminals.

In the following description, various methods for fabricating double-slanted gate connected field plates are provided with numerous details. Some details about the device structures may be omitted for better understanding of the present disclosure. For example, common processing steps (e.g., the formation of isolation regions or structures, various implant and annealing steps, planarization, the formation of interconnects, vias and contacts, formation of a passivation layer, or the surface cleaning steps) may be omitted in order to highlight the processing steps described. Figures depicting various embodiments of the disclosed technology including cross-sectional views of various gallium nitride (GaN) high electron mobility (HEMT) field effect transistors (FETs) are provided.

Figure 1:
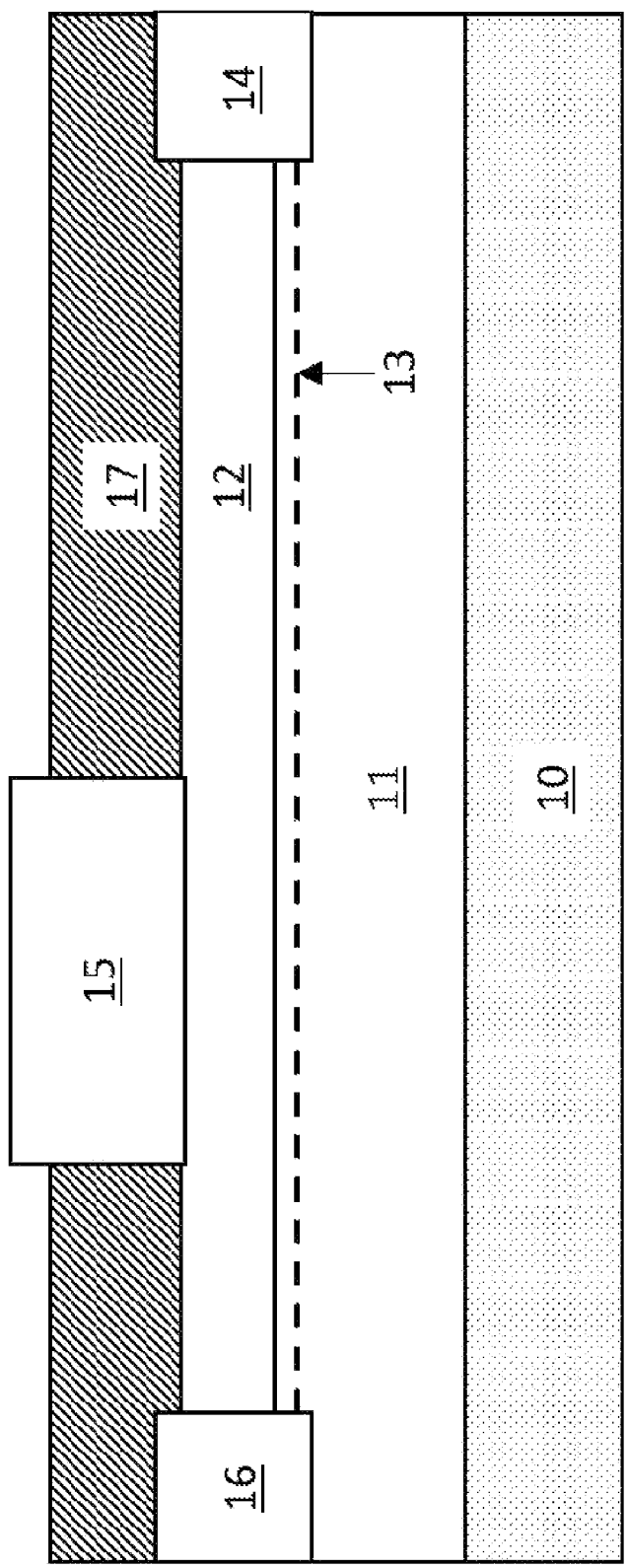
FIG. 1 depicts a cross-sectional view of one embodiment of a GaN HEMT.

FIG. 1 depicts one embodiment of a cross-sectional view of a GaN HEMT. The device consists of a substrate layer 10 which can be silicon, sapphire, silicon carbide or any other material suitable for making III-Nitride devices. Layers 11 and 12 are formed on top of layer 10. A layer may be formed on top of another layer using a deposition process such as chemical vapor deposition, physical vapor deposition, or atomic layer deposition. Layers 11 and 12 may comprise III-N materials of different compositions and each of which can consist of multiple sub-layers. A III-N material may comprise binary materials such as AlN, InN, or GaN or ternary material such as $Al_xGa_yN$ where x+y is about 1. In one embodiment, layer 11 is GaN and layer 12 is $Al_xGa_yN$ where x+y is about 1. A two-dimensional electron gas (2DEG) channel 13 is formed at the interface of layer with appropriate choice of layer 11 and 12 compositions. In another embodiment, layer 12 can be a stack of $Al_xGa_yN$ and a gate insulator on top of $Al_xGa_yN$. Source and drain electrodes 14 and 16 respectively, are formed such that some part of each electrode is in contact with the 2DEG 13. A gate electrode 15 is formed such that it is in contact with the layer 12. Gate insulator, if used, can be SiN, SiON, AlSiON or any insulating film that is thin to prevent leakage current to flow from gate 15 and drain 14 via 2DEG 13. The device structure can be designed to be depletion-mode or enhancement-mode operation. Passivation layer 17 is formed of an insulating material, such as $Si_3N_4$, $SiO_2$, or AlN or any stack consisting of a combination of these materials. The passivation layer 17 may comprise a dielectric layer.

First, layers 11 and 12 are epitaxially grown on substrate 10. Metal-organic Chemical Vapor Deposition (MOCVD), Molecular Beam Epitaxy (MBE) process can be used for the epitaxial growth of layers 11 and 12. Definition and sequence of source 16 and drain 14 electrodes is omitted here to focus the discussion on the gate electrode. Source 16 and drain 14 electrodes may be formed before or after forming the gate electrode.

Figure 2:
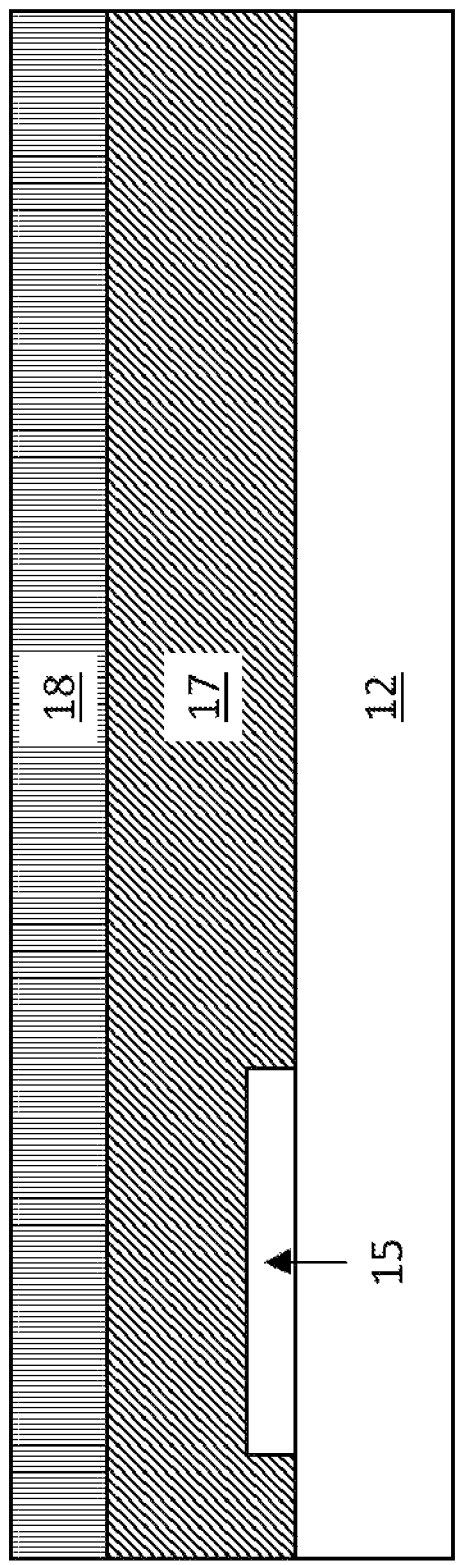
FIGS. 2, 3A, 3B, 4A, 4B, and 4C depict various cross-sectional views of a semiconductor device during fabrication.

FIG. 2 depicts one embodiment of a cross-sectional view of a wafer processed with layer 17 deposited on top of layer 12. Layer 17 can typically be deposited by Plasma-assisted Chemical Vapor Deposition (PECVD) process. In one embodiment, the gate electrode 15 or part thereof, has been formed on top of layer 12 prior to passivation layer 17 being deposited on top of it. Gate electrode can be formed by either lift-off process or deposition and etch of gate electrode material. In another embodiment, gate electrode 15 designates the region where the gate electrode would be formed through subsequent processing. A photoresist 18 is spin coated on top of passivation layer 17. The photoresist may be of positive or negative tone and furthermore, it may also be a stack of multiple layers comprising of photosensitive and non-photosensitive materials such as positive tone resist coated on top of lift-off resist.

Figure 3A:
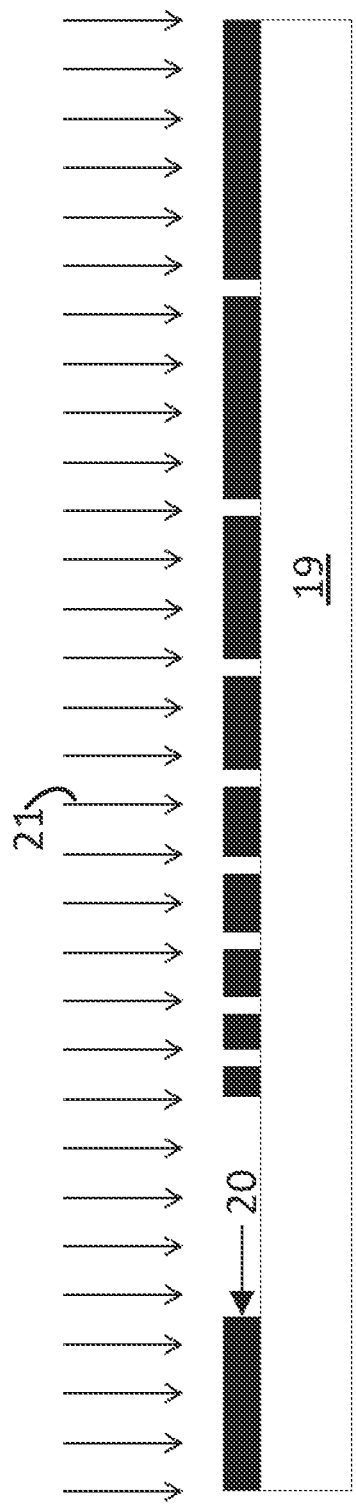

The wafer described herein may be exposed using a photomask with greyscale design illustrated on top of FIG. 3. In a typical photomask, design features are defined by etching away the chrome layer 20 located on a quartz 19 substrate. Opening in chrome layer 20 allows light 21 to pass through and be projected onto the wafer. For positive photoresists, regions that are exposed to light are crosslinked and can be dissolved away using appropriate chemicals such as tetramethylammonium hydroxide (TMAH). Sub-resolution features on photomask are defined on the photomask to allow fraction of the light intensity to be transmitted through the photomask. Using an appropriate exposure dose and regulated opening in chrome layer 20, the light intensity can be spatially modulated between 0% and 100% of the nominal exposure across the mask. Photoresist exposed with such spatially modulated light intensity will crosslink different amounts of thickness from the top surface of the photoresist. Photoresist in regions with 100% light intensity will be fully crosslinked and dissolve away during the develop step by solvent. Photoresist with partial light intensity between 0% and 100% will crosslink at thickness depending on photoresist contrast curve. In regions with 0% light intensity, i.e. no light, full thickness of photoresist will remain. In one embodiment, as shown in FIG. 3, the greyscale mask can be designed to create a uniformly slanted photoresist profile 22. The angle of the slant 8 is typically referenced from the bottom of the resist.

The photoresist profile depicted in FIG. 3, subsequent to light exposure and develop steps, is seldom ideally uniform; defects in photomask design and processing often lead to undesired variations in photoresist thickness. These defects can be healed, at least partially, by subjecting the wafer with photoresist after the develop step to high temperature reflow anneal. An improved profile can be realized through the optimization of time and temperature of the reflow anneal.

Figure 3B:
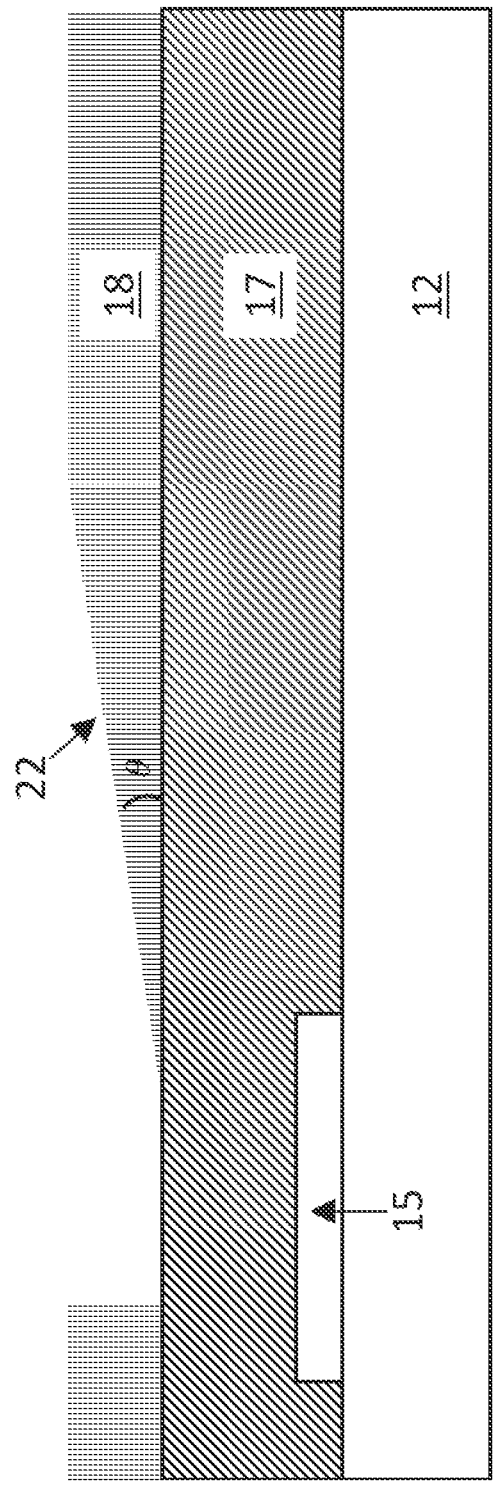
Figure 4A:
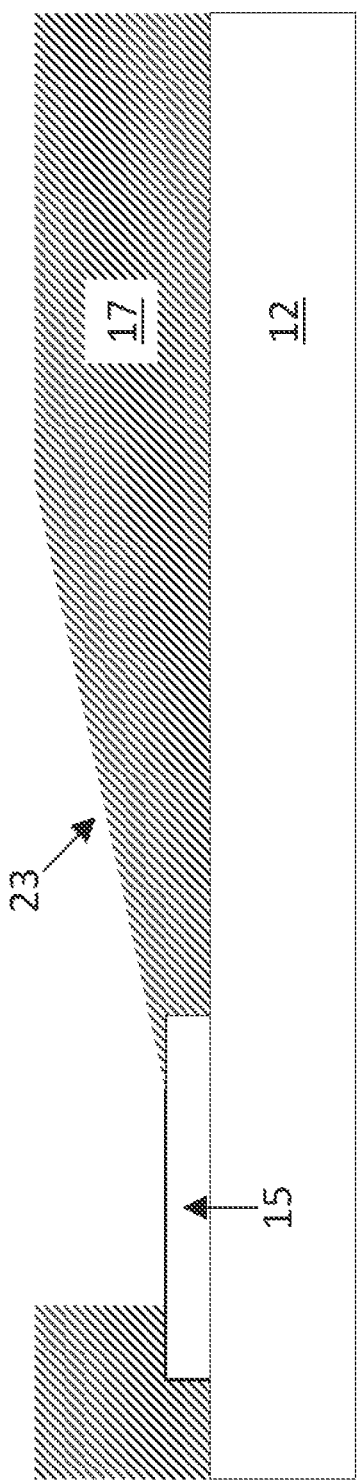

FIG. 4A depicts one embodiment of the cross-sectional view after the wafer described in FIG. 3B is subjected to dry or wet etch of the passivation layer 17, and in one embodiment, the photoresist 18 is stripped off by solvents. In another embodiment, the photoresist could be also be used to deposit gate material by lift-off process. Dry etch can be performed by reactive-ion etching (RIE) or inductively coupled plasma (ICP) etching process. In one embodiment, the gate electrode 15 was encapsulated by passivation layer 17 and in such case, the passivation layer on top of the gate electrode 15 can be completely removed to expose the gate electrode 15. The gate electrode 15 would typically be sized larger than the opening in passivation layer 17. Dry etching transfers the slant in photoresist 18 to slant in passivation layer 17. The angle of the slant 23 in passivation layer 17 would depend on incoming photoresist angle and the etch selectivity of photoresist to passivation layer material.

Figure 4B:
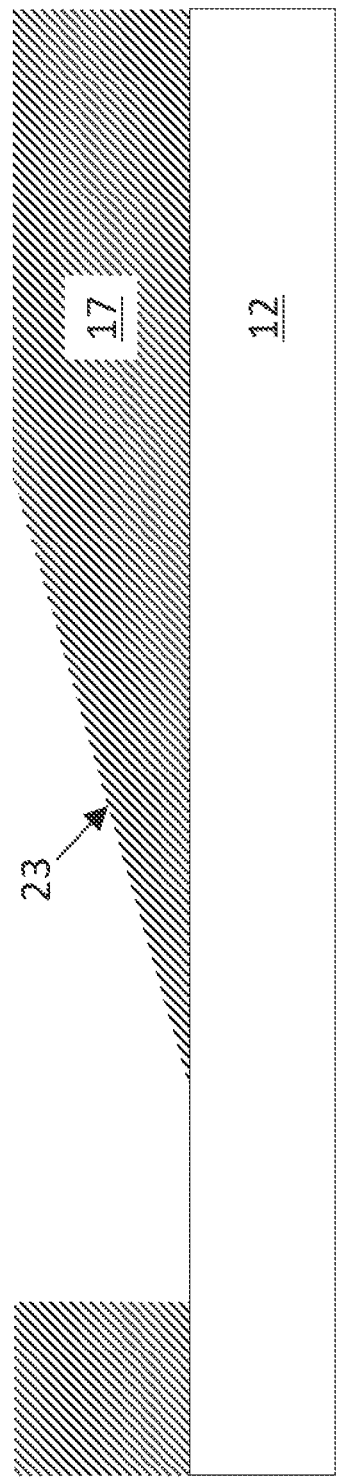
Figure 4C:
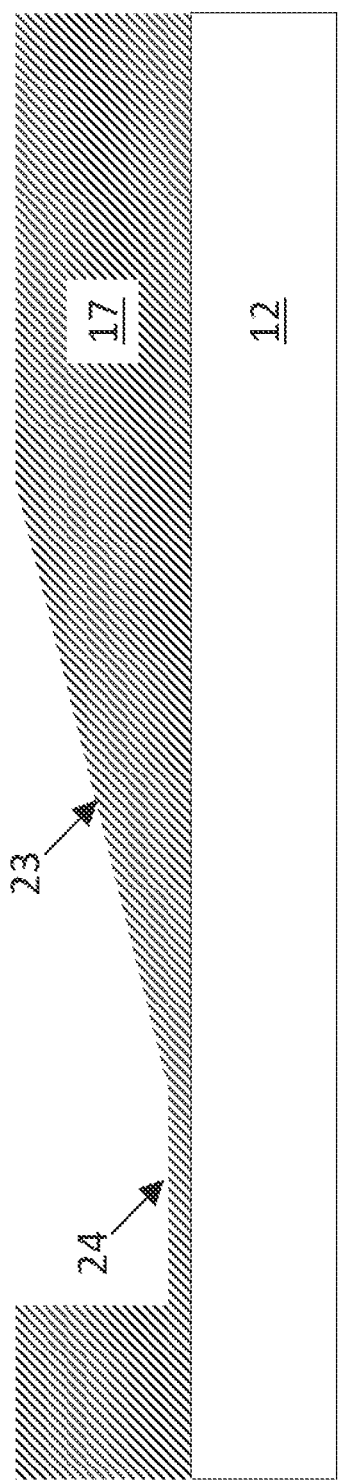

In another embodiment, the gate electrode 15 is not formed prior to the deposition of the passivation layer 17. The passivation layer 17 can be completely removed through dry or wet etch to expose some region of layer 12 as shown in FIG. 4B. Alternately, in another embodiment as shown in FIG. 4C, the passivation layer 17 is partially removed through dry or wet etch to stop short of exposing layer 12 and have some residual material 24 remain; for example, the etch could stop on a SiN or AlN etch stop layer which is part of layer 17.

Following the passivation layer 17 etch, the field plate material, typically metal stack, can be deposited through a lift-off process. In one embodiment, FIG. 5A shows the wafer after photoresist 25 has been spin coated, exposed and developed to define region of the field plate using a dedicated and separate photomask from the one used to define and etch passivation layer 17 in FIG. 3. In another embodiment, photoresist 25 can be the same photoresist 18 that was used to etch passivation layer 17 in FIG. 3. For lift-off process, the photoresist 25 can be multiple layer such as positive tone photoresist on top of lift-off resist (LOR).

Figure 6:
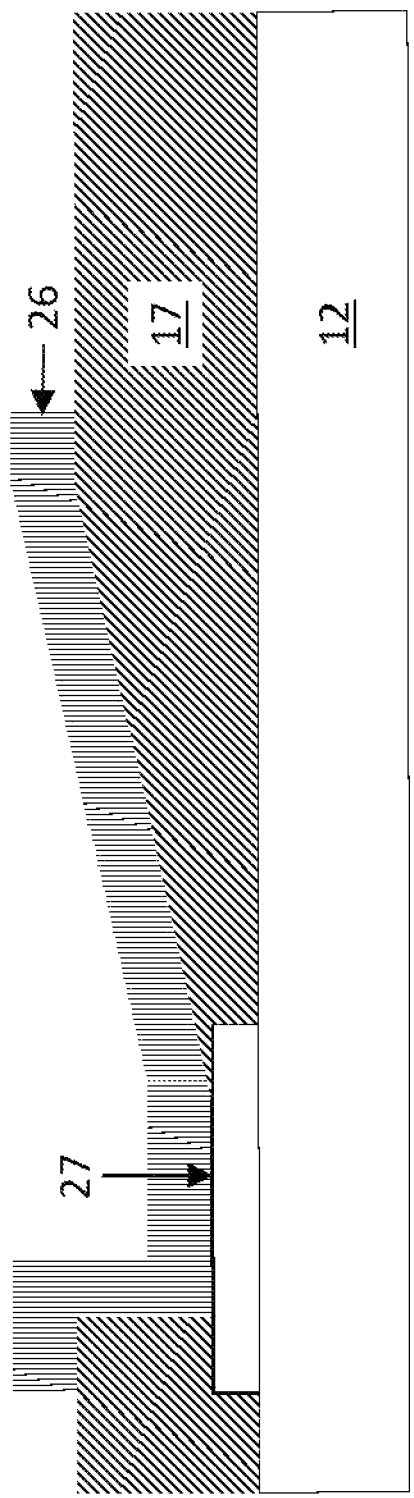
Figure 7:
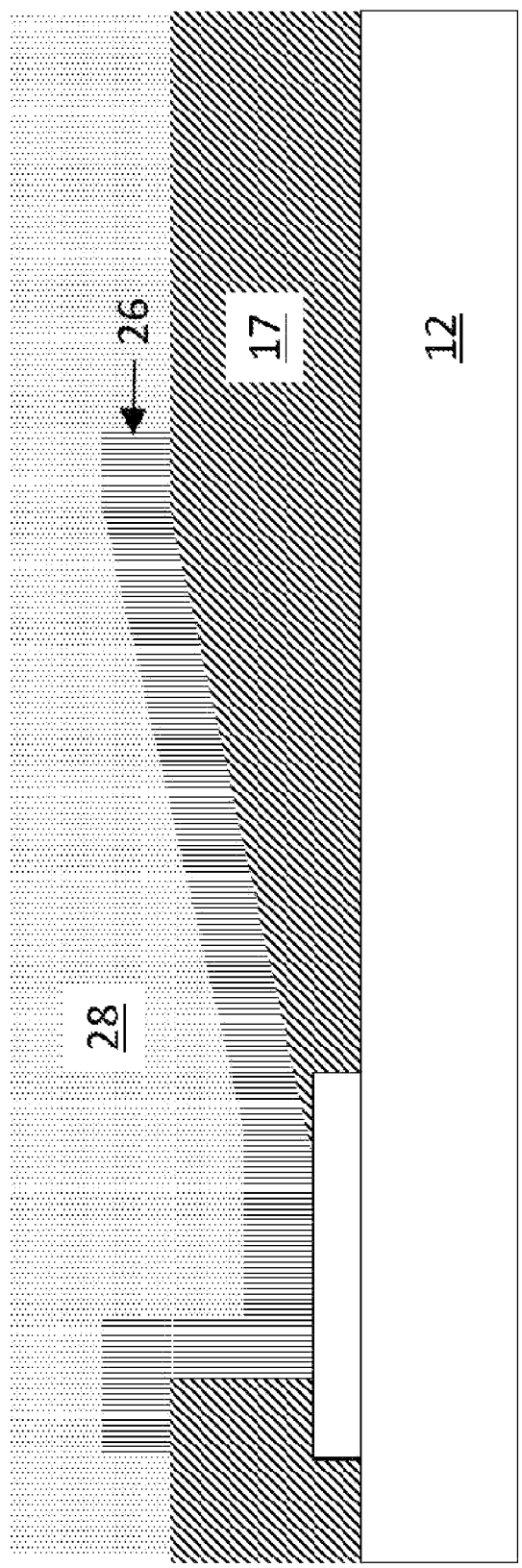

Following the definition of the field plate pattern on to the wafer, field plate metal stack 26 is deposited on to the wafer. Just prior to the metal deposition, prerequisite cleaning of gate electrode interface 27 is performed. In alternate embodiments, such as those shown in FIGS. 4B and 4C, the interface that needs to be cleaned could be with layer 12 or some portion of the passivation layer 17. The cleaning sequence is typically performed using some combination of wet chemical agents such as acids and solvents and ionic plasma. The metal stack 26 can be deposited using electron beam evaporation or sputtered using physical vapor deposition (PVD). Following the metal stack deposition, the photoresist 25 is stripped off the wafer using solvents. FIG. 6 shows the cross-sectional view after the photoresist 25 has been removed.

Alternately to depositing the field plate metal stack through the lift-off process, subtractive approach can be undertaken. In the subtractive process, first the field plate metal stack is blanket deposited on the wafer covering passivation layer 17 and the exposed gate electrode 15 region. Following the metal stack deposition, the photoresist 25 is spin coated, exposed and developed as shown in the cross-sectional view of FIG. 5B. The wafer would then be subjected to metal etch. The metal stack that is unprotected by photoresist would be etched away. Although wet etch process can be used, dry etch process in RIE or ICP tool may be the preferred method.

FIG. 3 provides an illustration of using greyscale lithography to create a uniformly slanted photoresist profile on one side of the clear area opening over the gate electrode whereas the opposite side was more abrupt. In another embodiment shown in FIG. 8A, using the same type of photomask, uniformly slanted photoresist profiles can be formed on both sides of the clear area opening over the gate electrode. By using an appropriate greyscale design, the left or source-side slope 30 and the right or drain-side slope 29 can be designed to be different to support different electric fields between gate-to-drain and gate-to-source. The slope of the source-side slope 30 may be the same as or different from the slope of the drain-side slope 29. In one example, the slope of the source-side slope 30 may be steeper (e.g., three times steeper) than the slope of the drain-side slope 29. The angle of the slant for the source-side slope 30 may be greater (e.g., four times greater) than the angle of the slant for the drain-side slope 29.

In another embodiment shown in FIG. 8B, the left or source-side staircase 32 and the right or drain-side staircase 31 can be designed to be staircase profiles instead of uniformly sloped profiles. The number of stair steps for the source-side staircase 32 may be less than the number of stair steps for the drain-side staircase 31. In one example, the number of stair steps for the source-side staircase 32 may comprise three steps and the number of stair steps for the drain-side staircase 31 may comprise five steps. In an alternative embodiment not depicted, a double-slanted gate connected field plate may comprise a source-side with uniform slope and a drain-side staircase with two or more steps. In some embodiments, a double-sided gate connected field plate comprising two different slopes, two different staircases, or a source-side slope and a drain-side staircase may be fabricated using greyscale lithography to concurrently create the different slopes and/or step profiles.

Without the use of greyscale lithography, an alternate method to creating a staircase profile on the source-side 32 or the drain-side 31 would require more process steps, and therefore would have higher processing cost. For example, without the use of greyscale lithography, to create two steps on the drain-side 31 staircase in passivation layer 17 would require two lithography and two etch steps; additional etch stop layers also may be required to included in the passivation layer 17 stack.

Figure 9A:
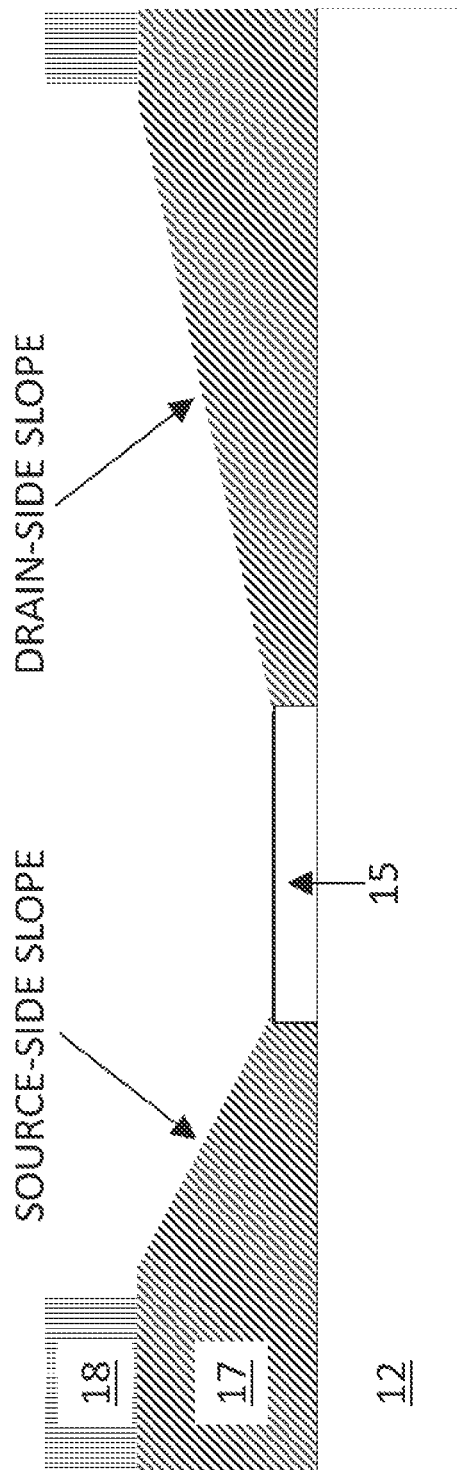
FIGS. 9A-9D depict various embodiments of process steps for forming a double-slanted gate connected field plate.
Figure 9B:
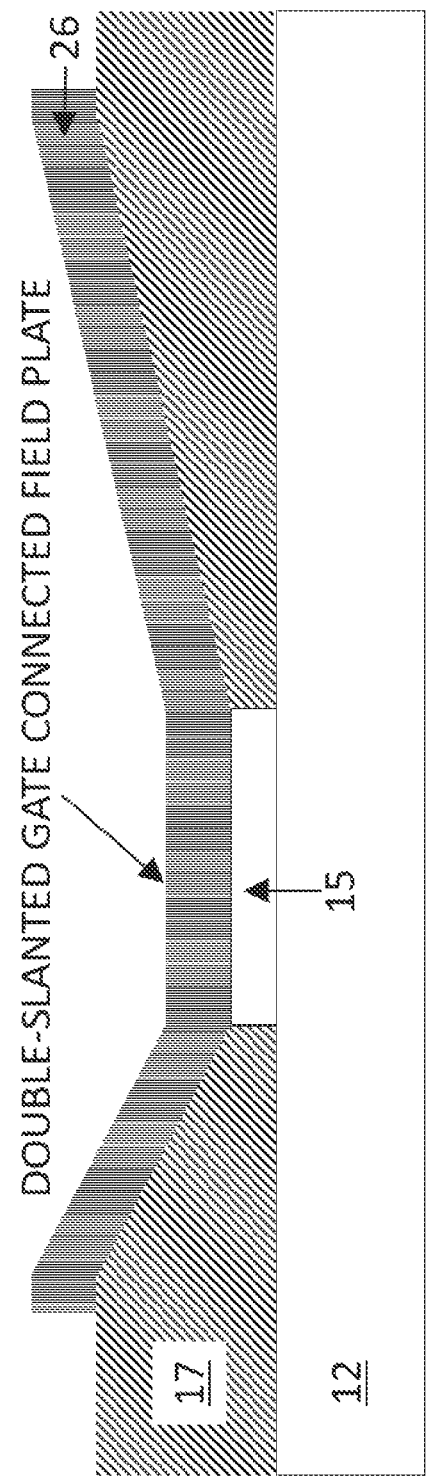
Figure 9C:
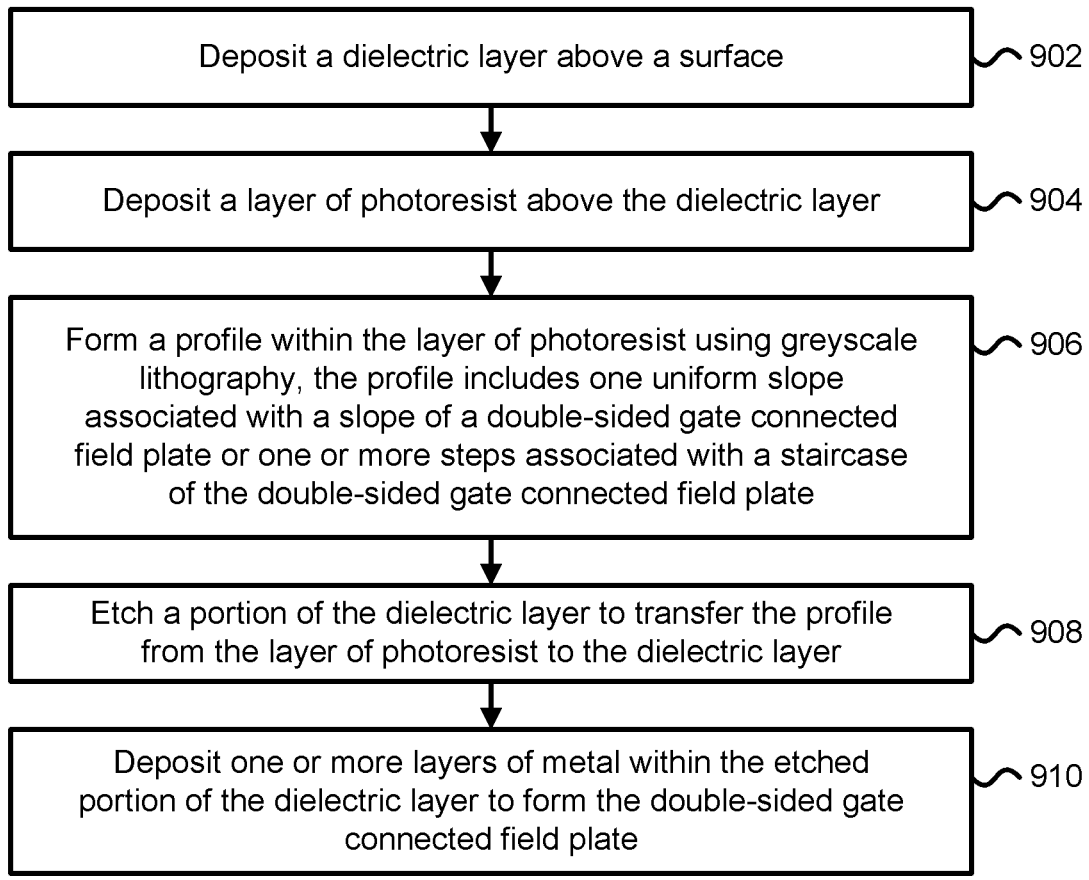
Figure 9D:
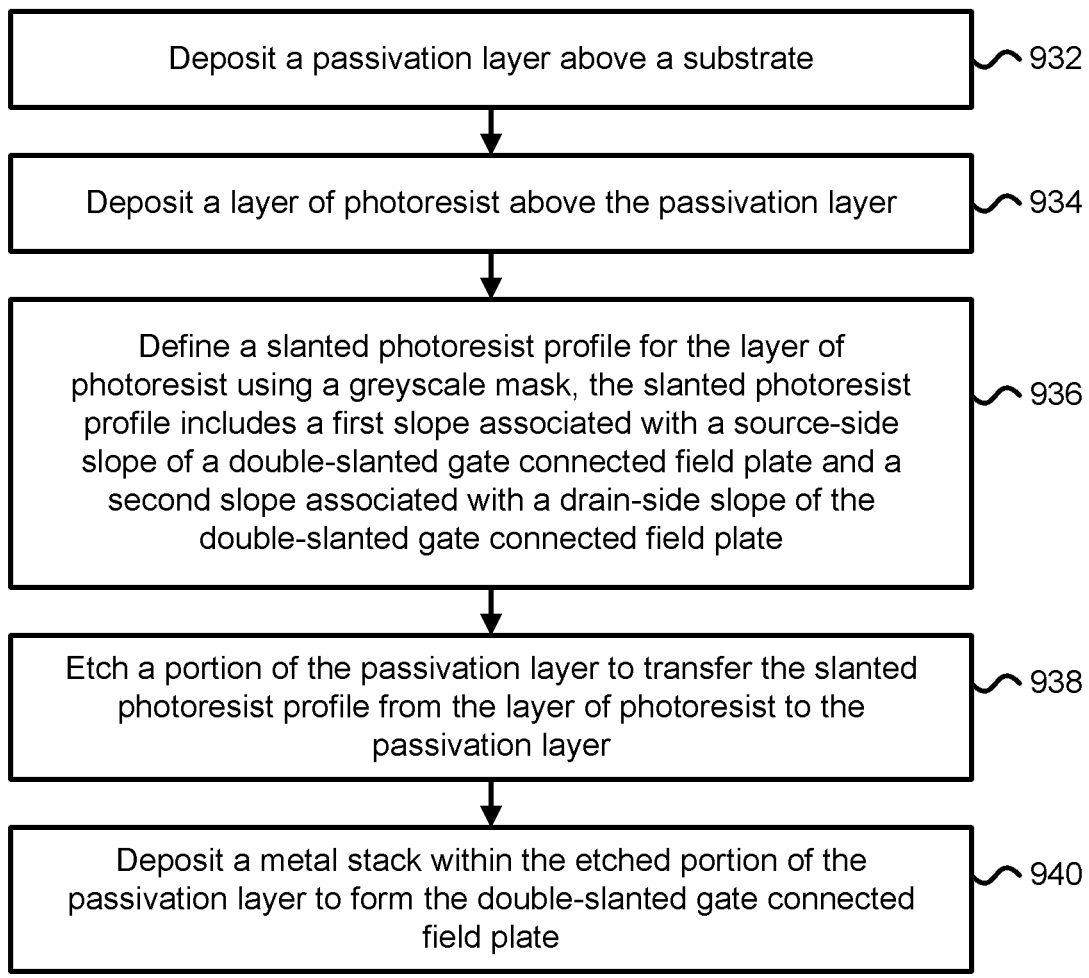

FIGS. 9A-9B depict one embodiment of process steps for forming a double-slanted gate connected field plate with a source-side slope and a drain-side slope. As depicted, metal stack 26 is deposited over and directly connects to gate electrode 15. The metal stack 26 forms a double-slanted gate connected field plate with a source-side slope and a drain-side slope that is different from the source-side slope.

A technical benefit of manufacturing the double-slanted gate connected field plate using greyscale lithography is that fabrication costs may be substantially reduced by reducing the number of process steps required to form the double-slanted gate connected field plate. The source-side slope and the drain-side slope of the double-slanted gate connected field plate may be concurrently formed with two different slopes or two different step profiles. As depicted in FIGS. 9A-9B, the source-side slope may be steeper than the drain-side slope. The drain-side portion of the double-slanted gate connected field plate may be longer (e.g., four times longer) than the source-side portion of the double-slanted gate connected field plate.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for fabricating a double-sided gate connected field plate using greyscale lithography, comprising:
depositing a dielectric layer above a surface;
depositing a layer of photoresist above the dielectric layer;
forming a profile within the layer of photoresist using greyscale lithography, the profile includes one uniform slope associated with a slope of the double-sided gate connected field plate or one or more steps associated with a staircase of the double-sided gate connected field plate;
etching a portion of the dielectric layer to transfer the profile from the layer of photoresist to the dielectric layer; and
depositing one or more layers of metal within the etched portion of the dielectric layer to form the double-sided gate connected field plate.

2. The method of claim 1, wherein:
the one or more steps associated with the drain-side staircase comprises three steps;
the slope of the double-sided gate connected field plate comprises a drain-side slope of the double-sided gate connected field plate; and
the staircase of the double-sided gate connected field plate comprises a drain-side staircase of the double-sided gate connected field plate.

3. The method of claim 1, wherein:
the forming the profile within the layer of photoresist using greyscale lithography includes forming a source-side slope for the double-sided gate connected field plate and one or more drain-side steps for the double-sided gate connected field plate.

4. A method for fabricating a field plate using greyscale lithography, comprising:
depositing a dielectric layer above a surface;
depositing a layer of photoresist above the dielectric layer;
forming a profile within the layer of photoresist using greyscale lithography, the profile includes one uniform slope associated with a slope of the field plate or one or more steps associated with a staircase of the field plate;
etching a portion of the dielectric layer to transfer the profile from the layer of photoresist to the dielectric layer; and
depositing one or more layers of metal within the etched portion of the dielectric layer to form the field plate, the field plate comprises a double-sided gate connected field plate.

5. The method of claim 4, wherein:
the forming the profile within the layer of photoresist includes defining a slanted photoresist profile for the layer of photoresist using a greyscale mask, the slanted photoresist profile includes a first slope associated with a source-side slope of the double-slanted gate connected field plate and a second slope associated with a drain-side slope of the double-slanted gate connected field plate.

6. The method of claim 5, wherein:
the first slope is steeper than the second slope.

7. The method of claim 5, wherein:
the defining the slanted photoresist profile includes exposing the layer of photoresist to light and then removing a portion of the layer of photoresist to form the slanted photoresist profile.

8. The method of claim 4, wherein:
the double-slanted gate connected field plate includes a first portion of the field plate associated with a source-side slope of the double-slanted gate connected field plate.

9. The method of claim 8, wherein:
the double-slanted gate connected field plate includes a second portion of the field plate associated with a drain-side slope of the double-slanted gate connected field plate.

* * * * *